United States Patent
Chi et al.

(10) Patent No.: US 8,803,581 B2
(45) Date of Patent: Aug. 12, 2014

(54) FAST FLIP-FLOP STRUCTURE WITH REDUCED SET-UP TIME

(75) Inventors: Shyh-An Chi, Hsinchu (TW); Shiue Tsong Shen, Tuku Township (TW); Jeff Lee, Taipei (TW); Frank Y. Lee, Baoshan Township (TW)

(73) Assignee: Taiwan Semiconductor Manufacturing Company, Ltd. (TW)

( * ) Notice: Subject to any disclaimer, the term of this patent is extended or adjusted under 35 U.S.C. 154(b) by 172 days.

(21) Appl. No.: 12/758,451

(22) Filed: Apr. 12, 2010

(65) Prior Publication Data

US 2010/0264972 A1   Oct. 21, 2010

Related U.S. Application Data

(60) Provisional application No. 61/169,467, filed on Apr. 15, 2009.

(51) Int. Cl.
*H03K 3/289* (2006.01)
*H03K 3/012* (2006.01)

(52) U.S. Cl.
CPC ...................................... *H03K 3/012* (2013.01)
USPC .......................................................... 327/202

(58) Field of Classification Search
None
See application file for complete search history.

(56) References Cited

U.S. PATENT DOCUMENTS

| | | | |
|---|---|---|---|
| 4,495,629 A | 1/1985 | Zasio et al. | |
| 5,175,447 A | 12/1992 | Kawasaki et al. | |
| 5,463,338 A | 10/1995 | Yurash | |
| 5,689,517 A * | 11/1997 | Ruparel | 714/731 |
| 5,983,377 A | 11/1999 | Knotts | |
| 6,006,348 A | 12/1999 | Sode et al. | |
| 6,456,113 B2 * | 9/2002 | Kanba | 326/93 |
| 2001/0035783 A1 | 11/2001 | Kanba | |
| 2003/0066002 A1 * | 4/2003 | Kanba | 714/726 |
| 2008/0024184 A1 * | 1/2008 | Wang | 327/202 |

OTHER PUBLICATIONS

Office Action dated Sep. 16, 2013 from corresponding application No. TW 099111763.

* cited by examiner

*Primary Examiner* — Sibin Chen

(74) *Attorney, Agent, or Firm* — Lowe Hauptman & Ham, LLP

(57) ABSTRACT

A flip-flop structure with reduced set-up time is provided. The flip-flop includes the first master latch receiving a function data through the first switch controlled by a clock signal, the second master latch receiving a scan data through the second switch controlled by the clock signal, and a slave latch connected to the first master latch through the third switch controlled by the clock signal. The second master latch is coupled to the first master latch through the fourth switch controlled by the scan enable signal so that the scan enable signal controls whether the function data or the scan data becomes an output from the first master latch to the slave latch, and the slave latch is used to latch and transmit the output from the first master latch.

23 Claims, 4 Drawing Sheets

FAST FLIP-FLOP STRUCTURE WITH REDUCED SET-UP TIME

CROSS-REFERENCE TO RELATED APPLICATIONS

The present application claims priority of U.S. Provisional Patent Application Ser. No. 61/169,467, filed on Apr. 15, 2009, which is incorporated herein by reference in its entirety.

TECHNICAL FIELD

This disclosure relates generally to a flip-flop structure with improved set-up time.

BACKGROUND

FIG. 1A is an example circuit block diagram of a typical delay path in a digital circuit. The delay path is widely applied to microprocessors and other digital circuits. The flip-flop 102 is coupled to a flip-flop 106 through combination logic 104. In the flip-flops 102, 106, D is the data input end, Q is the data output end, and CK is the clock signal receiving end. The flip-flops 102, 106 are controlled by the clock signal. FIG. 1B is an example clock diagram of the operating delay of FIG. 1A. Referring to FIG. 1A and FIG. 1B, during the first positive triggering of the clock signal, the flip-flop 102 releases data to the combinational logic unit 104. At this time, before the data is exactly displayed by the flip-flop 102, a CK-Q (clock versus output value) delay time interval 114 occurs. Once the data is generated by the flip-flop 102, it is input into the flip-flop 106 though the combinational logic 104, and the time interval for transmitting the data in the combinational logic unit 104 is the transmitting time interval 116. Moreover, the set-up time interval 118 is related to the state setting of the flip-flop 106. Therefore, the delay (critical timing) 112 can be considered to be the sum of the CK-Q time interval 114, the transmitting time interval 116, and the set-up time interval 118.

In conventional structures using multiplexers in addition to the latches either for multiple inputs or multiple latches, the multiplexer delay worsens the CK-Q time 114 or the set-up time 118, depending on where the multiplexer is placed. As a result, they have longer delay time 112. Also, even if a conventional structure does not use a multiplexer, reducing the delay time 112 is still an important issue. Accordingly, new structures and methods for flip-flops are desired that can reduce the overall delay 112.

BRIEF DESCRIPTION OF THE DRAWINGS

For a more complete understanding of the present disclosure, and the advantages thereof, reference is now made to the following descriptions taken in conjunction with the accompanying drawings, in which.

DETAILED DESCRIPTION OF ILLUSTRATIVE EMBODIMENTS

The making and using of the presently preferred embodiments are discussed in detail below. It should be appreciated, however, that the present disclosure provides many applicable concepts that can be embodied in a wide variety of specific contexts. The specific embodiments discussed are merely illustrative of specific ways to make and use the embodiments disclosed, and do not limit the scope of the invention.

A flip-flop structure with reduced set-up time is provided. Throughout the various views and illustrative embodiments of the present disclosure, like reference numbers are used to designate like elements.

Figure 1A:
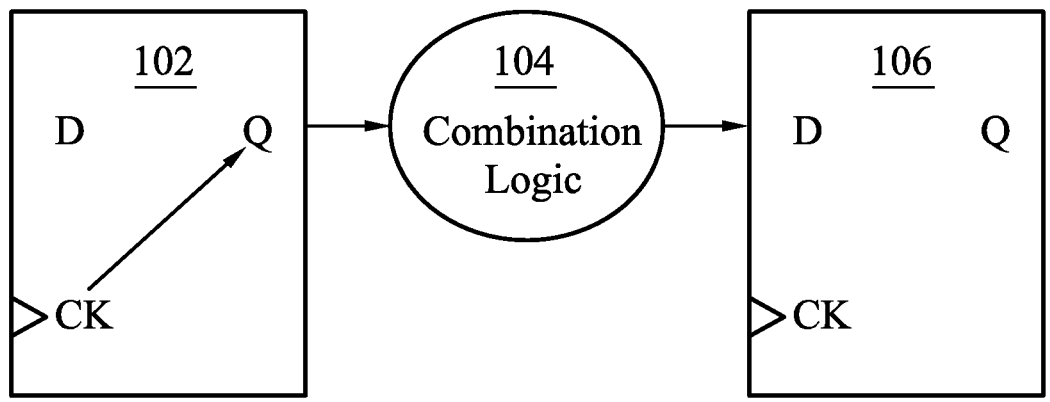
FIG. 1A is an example circuit block diagram of a typical delay path in a digital circuit.
Figure 1B:
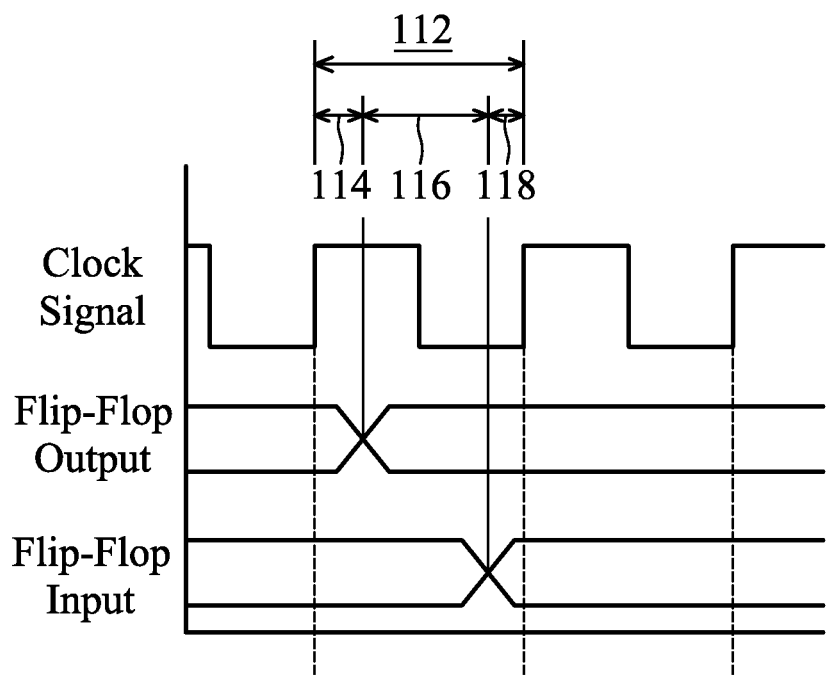
FIG. 1B is an example clock diagram of the operating delay of FIG. 1A.
Figure 2:
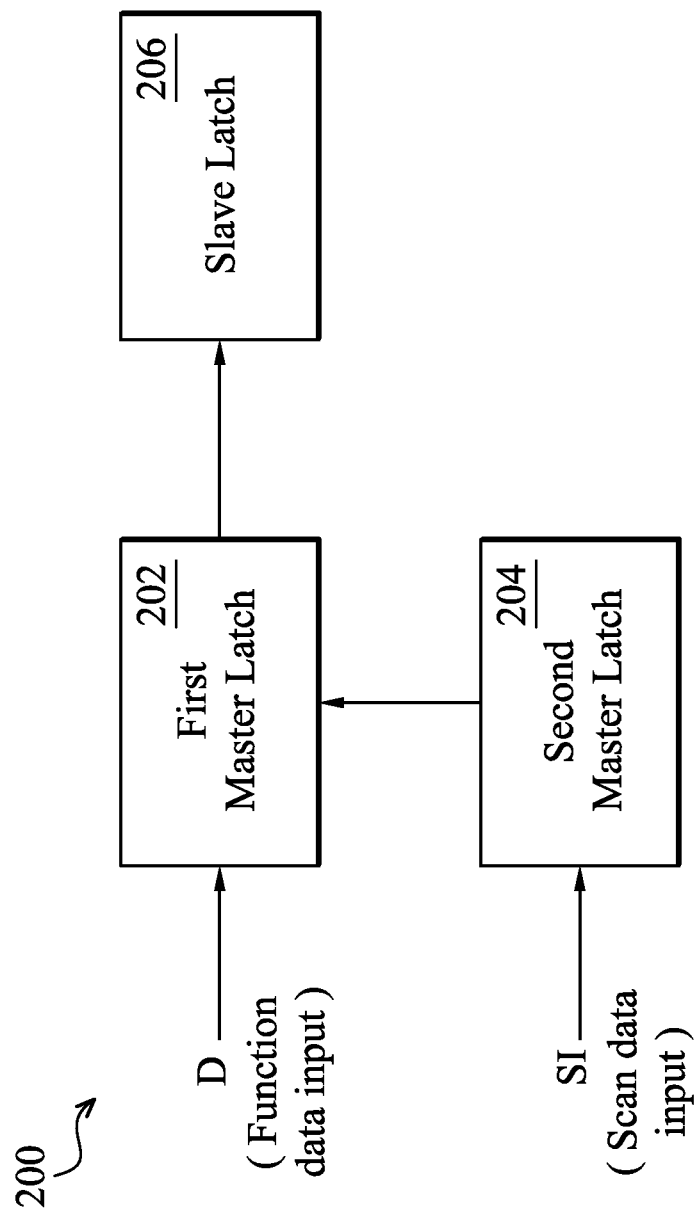
FIG. 2 illustrates a high-level block diagram for a flip-flop structure according to one aspect of this disclosure.

FIG. 2 illustrates a high-level block diagram for a flip-flop structure according to one aspect of this disclosure. The flip-flop 200 with reduced set-up time comprises the first master latch 202, the second master latch 204, and a slave latch 206. The function data input D is connected to the first master latch 202 and the scan data input (SI) is connected to the second master latch 204. The second master latch 204 is coupled to the first master latch 202 and the first master latch 202 is connected to the slave latch 206. The scan data in general has a clock rate less than 50 MHz and preset patterns, e.g. texting, etc. Also, the scan data can be predefined with specific logic. The function data typically has a clock rate faster than the scan data.

The present disclosure discloses embodiments that use two different master latches to separately process the function data and the scan data, such that it is not required for the flip-flop to achieve the unification of the clock for the process of the function data and the scan data. The second master latch 204 receiving the scan data input (SI) latches the scan data to the slave latch 206 when a control signal for the scan data is enabled. Otherwise, the first master latch 202 receiving the function data latches the function data to the slave latch 206. Because the second master latch 204 is coupled to the first master latch 202 without using a multiplexer, this structure reduces the set-up time of the flip-flop. Also, because the function data and the scan data are separately input to the first master latch 202 and the second master latch 204, there is no need to use a multiplexer for multiple inputs to a single latch. Using a multiplexer for multiple inputs will require longer set up time.

Figure 3:
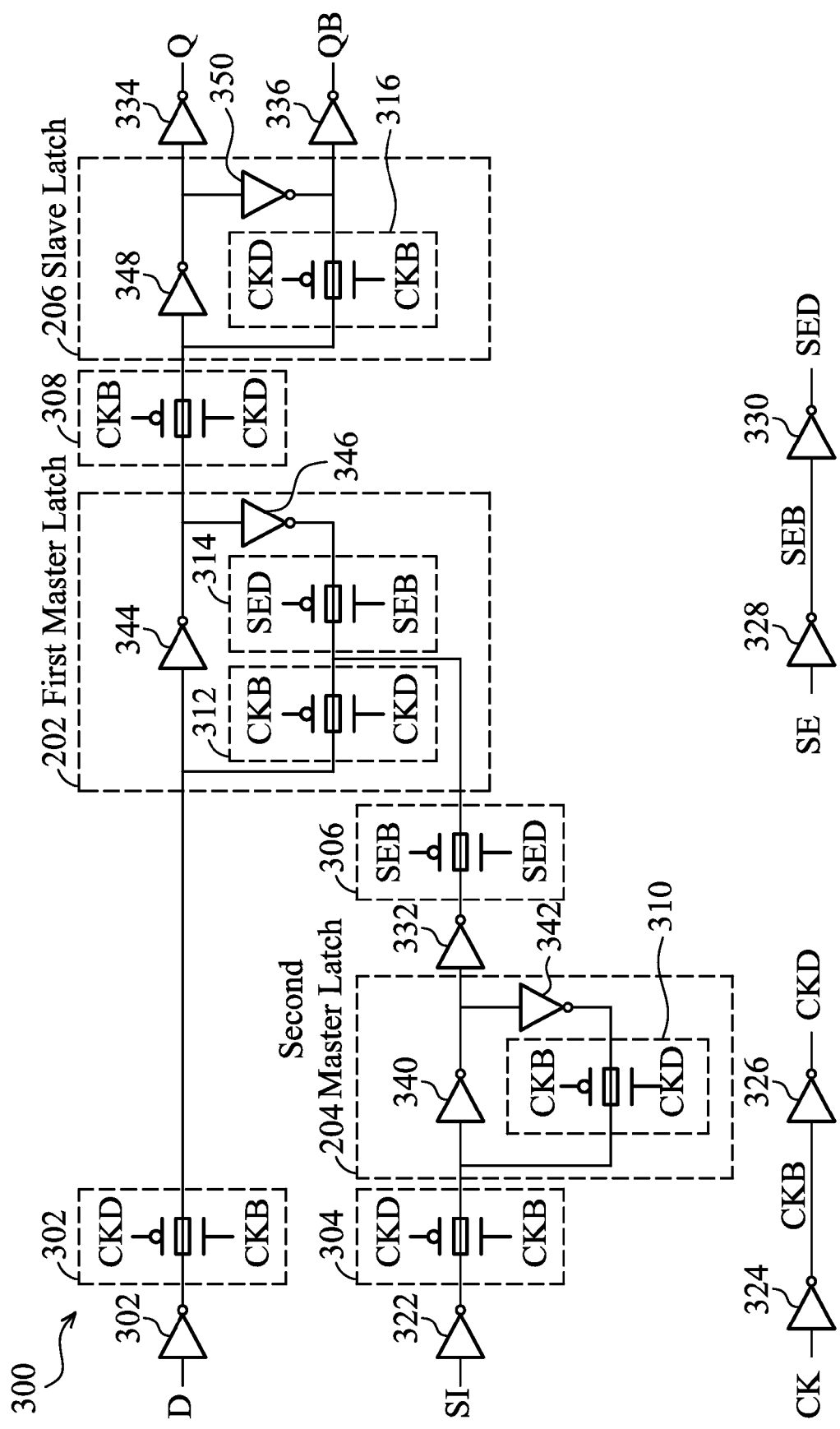
FIG. 3 illustrates an exemplary embodiment of a flip-flop structure shown in FIG. 2.

FIG. 3 illustrates an exemplary embodiment of a flip-flop structure shown in FIG. 2. The flip-flop 300 includes a first master latch 202, a second master latch 204, a slave latch 206, switches 302, 304, 306, 308, 310, 312, 314, 316, and inverters 320, 322, 324, 326, 328, 330, 332, 334, 336, 340, 342, 344, 346, 348, 350. The function data D is input to the first master latch 202 through the inverter 320 and the switch 302. The first master latch 202 comprises switches 312, 314, and inverters 344, 346. The switch 312 and 314 along with inverters 344 and 346 control the master latch 202 output. The master latch 202 passes either the function data D or the scan data SI to the slave latch 206 depending on the scan enable (SE) and the clock (CK) signal.

The clock signal CK generates a clock signal CKB through the inverter 324, and generates a clock signal CKD through the inverter 326. The clock signal CKB and the clock signal CKD are used to control the ON/OFF of the switches 302, 304, 308, 310, 312, and 316. The SE signal generates a SE signal SEB through the inverter 328, and generates a SE signal SED through the inverter 330. The SE signal SEB and the SE signal SED are used to control the ON/OFF of the switches 306 and 314. In this embodiment, the SE signal does not change its state at the CK signal's high phase. The scan data is input to the second master latch 204 through the inverter 322 and switch 304. The second master latch 204 comprises the switch 310 and inverters 340 and 342, and is used to latch and output the scan data input (SI) to the first master latch 202.

Depending on the SE, either the function data D or the scan data SI is latched from the first master latch 202 to the slave latch 206 through the switch 308. The slave latch 206 comprises a switch 316 and inverters 348 and 350. The slave latch 206 output is connected through inverters 334 and 336 to the output signal Q and the inverted output signal QB.

Figure 4:
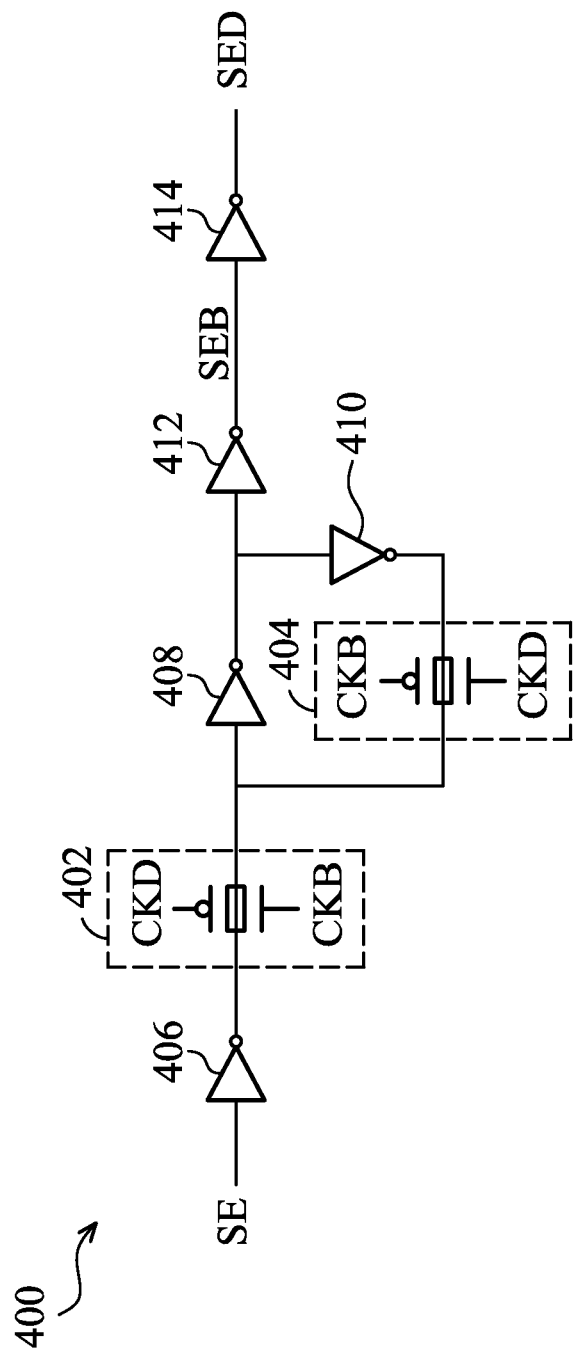
FIG. 4 illustrates an alternative embodiment of the scan enable (SE) signal for a flip-flop structure shown in FIG. 3.

FIG. 4 illustrates an alternative embodiment of the scan enable (SE) signal for a flip-flop structure shown in FIG. 3. The SE signal SEB is generated from a SE signal through the circuit including inverters 406, 408, 410, 412, and switches 402, 404. The switches 402 and 404 are controlled by the clock signals CKB and CKD. The SE signal SED is generated from SEB through the inverter 414. Compared to the circuit shown in FIG. 3 where the SE signal does not change its state at the CK signal's high phase, the SE signal in FIG. 4 will change its state at the CK signal's high phase. The user's test methodology can decide whether to use the scheme shown in FIG. 4 or not. The scheme in FIG. 4 doesn't need to be used if the user could make sure that SE does not change at clock's high phase. In this way, the size of this architecture is more compact. Otherwise, the scheme in FIG. 4 can be used to guarantee a correct function if SE will change its state at clock's high phase.

Although the present embodiments and their advantages have been described in detail, it should be understood that various changes, substitutions and alterations can be made herein without departing from the spirit and scope of the invention as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the present disclosure.

What is claimed is:

1. A flip-flop, comprising:
a first master latch receiving a function data;
a second master latch receiving a scan data; and
a slave latch connected to the first master latch;
wherein the second master latch is coupled to the first master latch,
wherein the coupling between the second master and the first master latch is adapted to control the first master latch to output the function data to the slave latch in response to a first state of a scan enable signal and to output the scan data received from the second master latch to the slave latch in response to a second state of the scan enable signal, and
wherein the slave latch is adapted to latch and transmit the output from the first master latch.

2. The flip-flop of claim 1, wherein the first master latch is adapted to receive the function data through a switch controlled by a clock signal.

3. The flip-flop of claim 1, wherein the second master latch is adapted to receive the scan data through a switch controlled by a clock signal.

4. The flip-flop of claim 1, wherein the first master latch is connected to the slave latch through a switch controlled by a clock signal.

5. The flip-flop of claim 1, wherein the second master latch is coupled to the first master latch through a switch controlled by the scan enable signal.

6. The flip-flop of claim 1, wherein the first master latch comprises a first switch, a second switch, a first inverter, a second inverter, and the first switch is controlled by a clock signal, the second switch is controlled by the scan enable signal, the first inverter is coupled to the second inverter through the second switch.

7. The flip-flop of claim 6, wherein the second master latch comprises a third switch, a third inverter, a fourth inverter, and the third switch is controlled by the clock signal, the third inverter is coupled to the fourth inverter through the third switch, so as to latch and output the scan data.

8. The flip-flop of claim 7, wherein the second master latch is coupled to the first master latch in between the first switch and the second switch.

9. The flip-flop of claim 1, wherein the slave latch comprises a first switch, a first inverter, a second inverter, and the first switch is controlled by a clock signal, the first inverter is coupled to the second inverter through the first switch, so as to latch and transmit the output from the first master latch.

10. The flip-flop of claim 1, wherein the scan enable signal does not change at a high phase of a clock signal.

11. The flip-flop of claim 1, wherein the scan enable signal changes at a high phase of a clock signal.

12. A flip-flop, comprising:
a first master latch adapted to receive a function data through a first switch, the first switch adapted to be controlled by a clock signal;
a second master latch adapted to receive a scan data through a second switch, the second switch adapted to be controlled by the clock signal; and
a slave latch connected to the first master latch through a third switch, the third switch adapted to be controlled by the clock signal;
wherein the second master latch is coupled to the first master latch through a fourth switch adapted to be controlled by a scan enable signal so that the flip-flop is adapted to control whether the function data or the scan data becomes an output from the first master latch to the slave latch based on the scan enable signal, and the slave latch is adapted to latch and transmit the output from the first master latch.

13. The flip-flop of claim 12, wherein the first master latch comprises a fifth switch, a sixth switch, a first inverter, a second inverter, and the fifth switch is controlled by the clock signal, the sixth switch is controlled by the scan enable signal, the first inverter is coupled to the second inverter through the sixth switch, and the flip-flop is adapted to pass the function data or the scan data to the slave latch depending on the scan enable signal.

14. The flip-flop of claim 13, wherein the second master latch comprises a seventh switch, a third inverter, a fourth inverter, and the seventh switch is controlled by the clock signal, the third inverter is coupled to the fourth inverter through the seventh switch, so as to latch and output the scan data.

15. The flip-flop of claim 14, wherein the second master latch is coupled to the first master latch in between the fifth switch and the sixth switch.

16. The flip-flop of claim 15, wherein the slave latch comprises an eighth switch, a fifth inverter, a sixth inverter, and the eighth switch is controlled by the clock signal, the fifth inverter is coupled to the sixth inverter through the eighth switch, so as to latch and transmit the output from the first master latch.

17. The flip-flop of claim 12, wherein the scan enable signal does not change at a high phase of the clock signal.

18. The flip-flop of claim 12, wherein the scan enable signal changes at a high phase of the clock signal.

19. The flip-flop of claim 12, wherein the scan enable signal is different from the clock signal.

20. The flip-flop of claim 12, wherein
   the first switch is configured to be opened by a first level of the clock signal,
   the second switch is configured to be opened by the first level of the clock signal, and
   the third switch is configured to be opened by a second level of the clock signal, the second level different from the first level.

21. A flip-flop, comprising:
   a first master latch adapted to receive a function data through a first switch, the first switch adapted to be controlled by a clock signal;
   a second master latch adapted to receive a scan data through a second switch, the second switch adapted to be controlled by the clock signal; and
   a slave latch connected to the first master latch through a third switch, the third switch adapted to be controlled by the clock signal;
   wherein the second master latch is coupled to the first master latch through a fourth switch adapted to be controlled by a scan enable signal so that the flip-flop is adapted to control whether the function data or the scan data becomes an output from the first master latch to the slave latch based on the scan enable signal, the slave latch is adapted to latch and transmit the output from the first master latch, and the scan enable signal adapted to change at a high phase of the clock signal.

22. The flip-flop of claim 21, wherein the first master latch comprises a fifth switch, a sixth switch, a first inverter, a second inverter, and the fifth switch is controlled by the clock signal, the sixth switch is adapted to be controlled by the scan enable signal, the first inverter is coupled to the second inverter through the sixth switch, the flip-flop adapted to pass the function data or the scan data to the slave latch depending on the scan enable signal, and the second master latch is coupled to the first master latch in between the fifth switch and the sixth switch.

23. The flip-flop of claim 21, further comprising a fifth switch, a sixth switch, a first inverter, and a second inverter, wherein
   each of the first and second inverters has an input and an output,
   the input of the first inverter is adapted to receive the scan enable signal through the fifth switch,
   the output of the first inverter is coupled to the input of the second inverter,
   the output of the second inverter is coupled to the input of the first inverter through the sixth switch, and
   the fifth and sixth switches are adapted to be controlled by the clock signal.

* * * * *